(12) United States Patent
Bowen et al.

(10) Patent No.: US 6,338,025 B1
(45) Date of Patent: Jan. 8, 2002

(54) DATA PROCESSING SYSTEM AND METHOD TO ESTIMATE POWER IN MIXED DYNAMIC/STATIC CMOS DESIGNS

(75) Inventors: Michael Alexander Bowen, Poughkeepsie, NY (US); Byron Lee Krauter, Austin, TX (US); Steven Arthur Schmidt, Leander, TX (US); Clay Chip Smith; Amy May Tuvell, both of Austin, TX (US)

(73) Assignee: International Business Machines Corp., Armonk, NY (US)

(*) Notice: Subject to any disclaimer, the term of this patent is extended or adjusted under 35 U.S.C. 154(b) by 0 days.

(21) Appl. No.: 09/168,589

(22) Filed: Oct. 8, 1998

(51) Int. Cl.$^7$ .............................................. G06F 19/00
(52) U.S. Cl. ......................... 702/60; 702/52; 702/117; 716/4; 716/6; 703/14; 703/15; 703/18; 703/19
(58) Field of Search ................... 702/60–62, 117–120, 702/123–126, 182, 183, 189, FOR 103, FOR 104, FOR 106, FOR 134, FOR 135, FOR 170, FOR 171; 703/13–15, 18, 19; 716/6, 11, 18, 4, 13; 324/73.1, 765, 769

(56) References Cited

U.S. PATENT DOCUMENTS

| | | | |
|---|---|---|---|
| 4,263,651 A | 4/1981 | Donath et al. ................ 716/6 |
| 4,698,760 A | 10/1987 | Lembach et al. .............. 716/6 |
| 5,210,700 A | 5/1993 | Tom ............................. 716/6 |
| 5,349,542 A | 9/1994 | Brasen et al. ................. 703/15 |
| 5,473,548 A | 12/1995 | Omori et al. .................. 716/6 |
| 5,481,469 A | * 1/1996 | Brasen et al. ................. 702/60 |
| 5,481,484 A | 1/1996 | Ogawa et al. ................. 703/19 |
| 5,502,649 A | 3/1996 | Hirata ........................... 716/6 |
| 5,521,834 A | 5/1996 | Crafts et al. .................. 716/6 |
| 5,535,370 A | 7/1996 | Raman et al. ................ 703/15 |
| 5,553,002 A | 9/1996 | Dangelo et al. ............. 716/11 |
| 5,572,436 A | 11/1996 | Dangelo et al. ............. 716/18 |
| 5,940,779 A | * 8/1999 | Gaitonde et al. ............ 702/60 |
| 6,021,381 A | * 2/2000 | Ohnishi ........................ 202/60 |

OTHER PUBLICATIONS

"Quick VLSI CMOS Power Estimates", IBM Technical Disclosure Bulletin, vol. 33, No. 6A, Nov. 1990, pp. 433–435.

* cited by examiner

Primary Examiner—Hal Wachsman
(74) Attorney, Agent, or Firm—Barry S. Newberger; Winstead Sechrest & Minick P.C.; Robert M. Carwell

(57) ABSTRACT

An apparatus and method for determining power consumption in logic devices including mixed static and dynamic logic blocks is implemented. Input logical signals are tagged as having dynamical behavior or static behavior, and the power consumption of the logic block determined according to the behavior of the input signal. If an input signal has dynamic behavior, an output signal making a transition in response thereto will make two transitions per clock cycle, and the per cycle power consumption of the logic block is accordingly weighted. In another embodiment, a Boolean behavior signal is calculated for each block from clock phase tags and "one cycle per cycle" circuit level simulations. The per cycle power consumption of each logic block receives a weight in response to the Boolean behavior signal, according the behavior of the block characterized thereby.

46 Claims, 6 Drawing Sheets

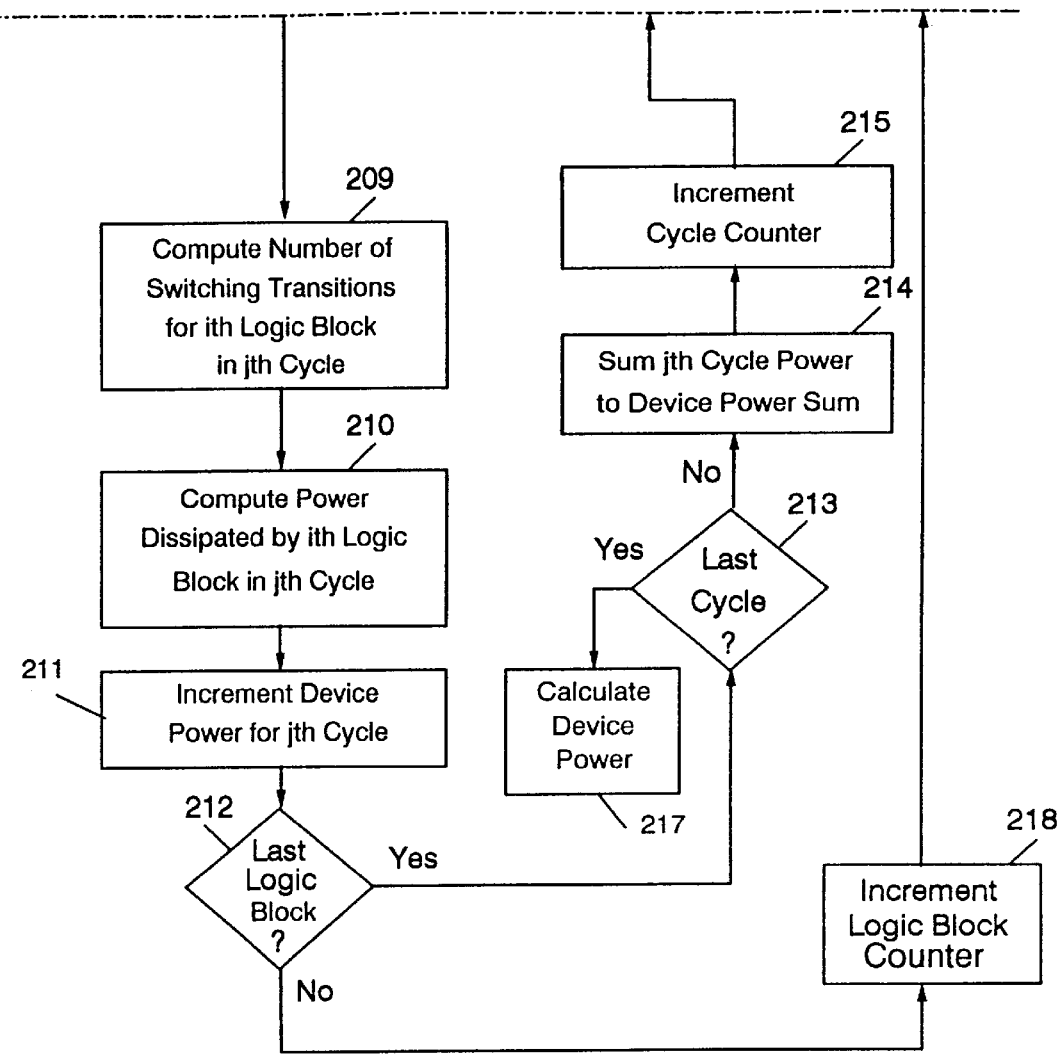
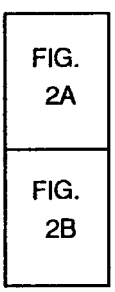
FIG. 2
FIG. 2B

DATA PROCESSING SYSTEM AND METHOD TO ESTIMATE POWER IN MIXED DYNAMIC/STATIC CMOS DESIGNS

TECHNICAL FIELD

The present invention relates to CMOS logic in general, and in particular, to CMOS logic including mixed dynamic and static logic types.

BACKGROUND INFORMATION

Power dissipation in CMOS logic chips is linearly dependent on the switching activity in the logic circuits on the chip. In the static state, CMOS logic dissipates almost no power. However, when a CMOS circuit switches between logic states, power is dissipated. Thus, as the frequency of switching between logic states increases, the power dissipated in a CMOS logic circuit increases in direct proportion to the switching frequency.

This switching activity is dependent on the input signal supplied, the logic function implemented, and the circuit type used as the switching activity in static logic circuits and in dynamic logic circuits differs even when the same logic function is implemented. Moreover, the clock circuits themselves consume power in the transition between the phases of the clock. However, the switching activity of the clock circuits is constant and always is equal to two transitions per clock cycle. In other words, the switching frequency of the clock circuits is always twice the clock frequency itself.

In order to determine the power dissipation in a logic chip, it is therefore necessary to account for the switching activity of the logic circuits constituting the logic chip. This complicates the design of logic chips employing mixed static CMOS logic circuits and dynamic CMOS logic circuits.

Static logic is designed under a constraint that logic signals change state no more than once per clock cycle. That is, in a logic circuit consisting entirely of static CMOS circuits, all switching, is "visible," i.e., directly apparent by a comparison of states at the end of each clock cycle, since an output either transitions once from the preceding clock cycle to the current clock cycle, or does not transition at all. Therefore, for static logic circuits, circuit power can be calculated from one-cycle logic simulations, where the logic state of the circuit is determined at the end of each clock cycle.

For dynamic logic, however, output signals may change more than once per cycle. Therefore, for dynamic logic, switching activity cannot be measured by an analysis based merely on states at the end of each clock cycle. That is, in a dynamic logic circuit, not all switching is visible. Thus, in logic circuits including both dynamic and static circuitry, one-cycle logic simulations, according to the prior art, cannot be used to determine power consumption. Moreover, not only do dynamic elements behave differently than static elements, but static elements behave one way in isolation and another way if the static elements follow dynamic elements. Consequently, computational resources are consumed by the additional simulations required for determining dynamic logic switching activity and mixed, static-dynamic logic switching activity. Also, designers must create different logic models for these simulations, thereby consuming designer resources. Thus, there is a need in the art for methods and apparatus to determine the power consumption in logic circuits including mixed dynamic and static logic elements, without the requirement that each clock transition be simulated.

SUMMARY OF THE INVENTION

The previously mentioned needs are addressed with the present invention. Accordingly, there is provided, in a first form, a method of determining power consumption in a logic device. The method includes the steps of inputting first and second tagged logic signals, wherein a tag has a first predetermined value if the input signal has dynamic behavior and a second predetermined value if the input signal has static behavior, and wherein the first logic signal constitutes a logic state of the logic device in a current cycle and the second logic signal constitutes a logic state in a previous cycle. The method also includes determining a number of switching transitions from the first and second tagged logic signals, and outputting a power consumption value, wherein the power consumption value is formed from a per transition power consumption value multiplied by a clock signal frequency further multiplied by the number of switching transitions.

In another embodiment, the method includes the steps of determining a Boolean circuit behavior signal of the logic device in response to a plurality of clock edge tags and corresponding plurality of output transition logic signals, inputting first and second logical output signals of the logic device wherein the first and second output signals constitute a logical state of the logic device in a current cycle and a previous cycle, respectively. The method also includes the step of determining a number of transitions of the logic device in the current cycle from the Boolean circuit behavior signal and the first and second logical output signals. The step of outputting a power consumption value includes multiplying a per transition power consumption value by a clock signal frequency and further multiplying the product by the number of transitions.

There is also provided, in a second form, a data processing system. The data processing system includes circuitry operable for inputting first and second tagged logic signals, wherein a tag has a first predetermined value if any input signal has dynamic behavior and a second predetermined value if the input signal has static behavior, and wherein the first logic signal comprises a logic state of a logic device in a current cycle and the second logic signal comprises a logic state in a previous cycle. The data processing system further includes circuitry operable for determining a number of transitions from the first and second tagged logic signals, and circuitry operable for outputting a power consumption value, wherein the power consumption value is formed from a per transition power consumption value multiplied by a clock signal frequency further multiplied by the number of transitions.

In another embodiment, the data processing system contains circuitry operable for determining a Boolean circuit behavior signal of the logic device in response to a plurality of clock edge tags and a corresponding plurality of output transition logic signals, and circuitry operable for inputting first and second logical output signals of the logic device wherein the first and second output signals constitute a logical state of the logic device in a current cycle and a previous cycle, respectively. The data processing system also contains circuitry operable for determining a number of transitions of the logic device in the current cycle from the Boolean circuit behavior signal and the first and second logical output signals, and circuitry operable for outputting a power consumption value, wherein the power consumption value is formed from a per transition power consumption value multiplied by a clock signal frequency further multiplied by the number of transitions.

Additionally, there is provided, in a third form, a program product adaptable for storage on a program storage media, the program product operable for determining power consumption in a logic device. The program product includes programming for inputting first and second tagged logic signals, wherein a tag has a first predetermined value if the input signal has dynamic behavior and a second predetermined value if the input signal has static behavior, and wherein the first logic signal constitutes a logic state of the logic device in a current cycle and the second logic signal constitutes a logic state in a previous cycle, and programming for determining a number of switching transitions from the first and second tagged logic signals. The program product further includes programming for outputting a power consumption value, wherein the power consumption value is formed from a per transition power consumption value multiplied by a clock signal frequency further multiplied by the number of switching transitions.

In another embodiment, the program product adaptable for storage on a program storage media, includes programming for determining a Boolean circuit behavior signal of the logic device in response to a plurality of clock edge tags and corresponding plurality of output transition logic signals, and programming for inputting first and second logical output signals of the logic device wherein the first and second output signals constitute a logical state of the logic device in a current cycle and a previous cycle, respectively. The program product further includes programming for determining a number of transitions of the logic device in the current cycle from the Boolean circuit behavior signal and the first and second logical output signals, and programming for outputting a power consumption value, wherein the power consumption value is formed from a per transition power consumption value multiplied by a clock signal frequency further multiplied by the number of transitions.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A and 2B illustrates a flow diagram in accordance with another embodiment of a method of the present invention;

DETAILED DESCRIPTION

Figure 1:
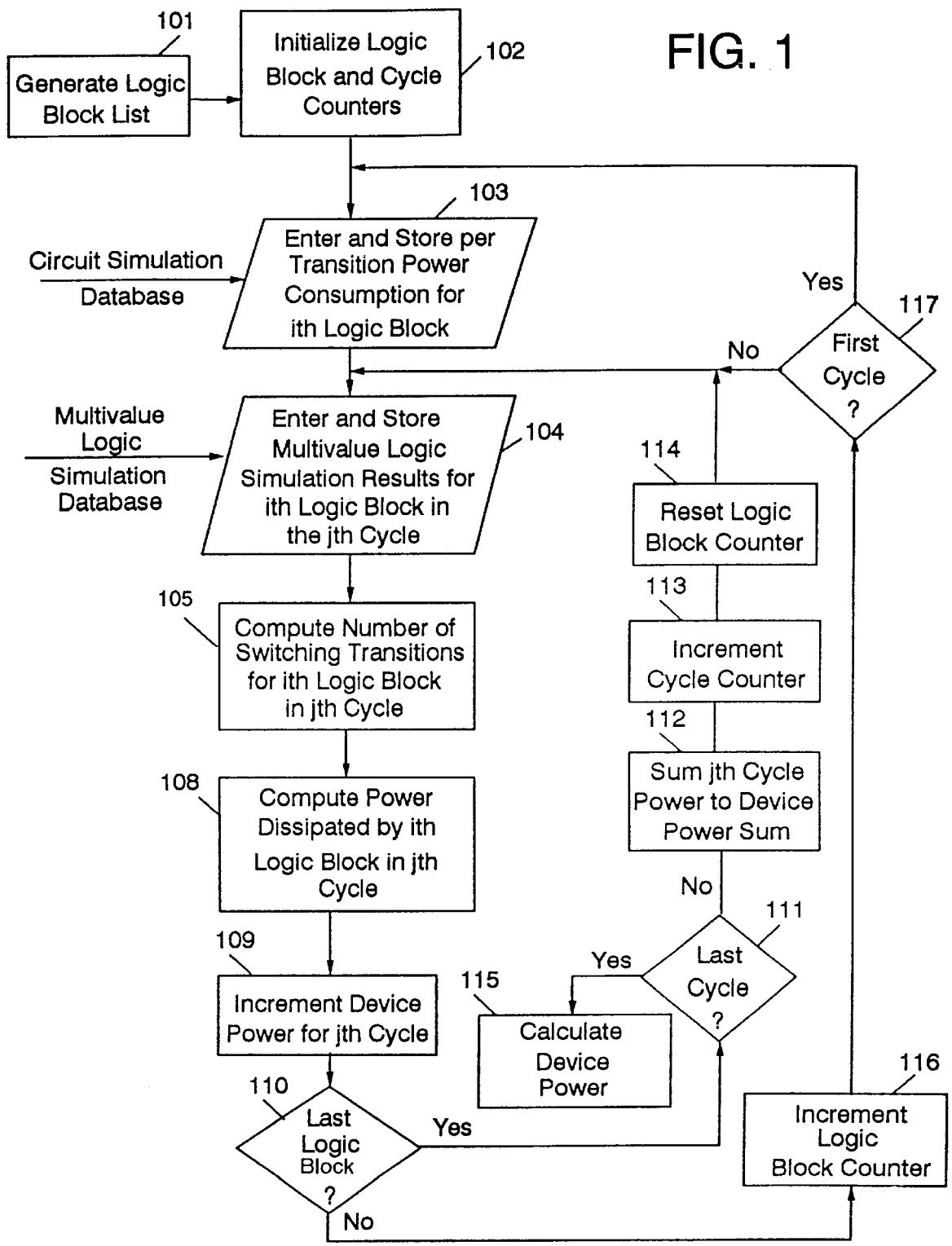
FIG. 1 illustrates a flow diagram in accordance with an embodiment of a method of the present invention.

In a dynamic CMOS logic circuit, the circuit is supplied with a clock signal in addition to the logical input signals. The clock signal is divided into a reset and evaluate phase. During the reset phase of the clock signal, the dynamic CMOS logic circuit is reset to a fixed state independent of the logical input states. During the evaluate phase of the clock signal, the logical inputs resume control of the circuit and its output state.

Depending on the logical input signals present during the evaluate phase of the clock cycle, the dynamic CMOS logic circuit may make either zero or two transitions per clock cycle. Two transitions occur when the evaluate and reset (or precharge) states differ and no transitions occur when they are identical.

By contrast, static CMOS logic circuits are not reset with every clock signal, although the input logic signals controlling these circuits will be synchronous with the clock signal. As such, only a change in state of the input signals may cause the output signal to change state. However, because the input signals' state changes only once per clock cycle, the output signal of a static CMOS logic circuit can only change, at most, once per clock cycle. Moreover, depending on the input logic signals, and the logic function implemented by the static CMOS logic circuit, the output need not change at all during a particular clock cycle. In other words, for static CMOS logic circuits, the switching activity, per clock cycle, may either be zero or one per clock cycle and switching activity can be derived from cycle to cycle transition information.

Thus, for logic circuits composed entirely of static CMOS circuits, the circuit power can be calculated from one-cycle logic simulations. In such simulations, the logic state of the circuit is determined at the end of each clock cycle. In a logic circuit consisting entirely of static CMOS circuits, all switching is visible, and an output either transitions from the preceding clock cycle to the current clock cycle, one transition, or the output does not transition.

In a logic circuit including only dynamic circuits, not all switching is visible, but the switching activity can be inferred, by knowing the reset (or precharge) state of the circuit and the evaluation state (or logical state) in the current cycle. If the two differ, then two switching transitions have taken place. If the two are identical, then no switching transitions have taken place. Thus, in all instances, the number of switching transitions can be determined from state information in the current cycle. Then, from circuit level simulations that determine the per transition power consumption, the power consumption for each logical element can be determined on a cycle-by-cycle basis. Then, the power consumption of the entire logic circuit can be determined by summing up the power consumption of each logical element comprising the logic circuit.

However, in logic circuits including both dynamic and static elements, one-cycle logic simulations, according to the prior art, cannot be used to determine power consumption. Static elements following dynamic elements assume dynamical behavior. In other words, a static element that receives an output from a dynamic element, may switch twice per clock cycle, if the dynamic element switches twice per clock cycle. Thus, a power calculation that simply assumed that all static elements make either zero or one transition per clock cycle would underestimate the power consumption of logic circuits including mixed dynamic and static logic elements. In order to properly account for the power consumption of such logic circuits, according to the prior art, two cycle per cycle (more precisely two half-cycles per cycle) logic simulations are used. Then, the states at each node of the logic circuit at each clock edge are properly accounted for, and the power consumption of static logic elements receiving inputs from dynamic logic elements may be correctly computed.

However, two cycle per cycle logic simulations consume additional resources in both manpower and computation. Twice the number of clock edges must be modeled, and because every dynamic circuit must be logically modeled with memory elements, the logic models include additional complexity.

The present invention alleviates the need for two-cycle per cycle simulations in the generation of power consumption data in logic devices including mixed dynamic and static logic blocks. In a first embodiment, logic level simulation tagging via four-value truth tables are used to properly account for power consumption in static blocks exhibiting dynamic switching behavior. In a second embodiment, static timer data including clock phase tags are used to account for static and dynamic behavior, thereby permitting proper accounting for power consumption with mixed static and dynamic blocks.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

The present invention alleviates the need for two-cycle per cycle simulations in the generation of power consumption data in logic devices including mixed dynamic and static logic blocks. In a first embodiment, logic level simulation tagging via four-value truth tables are used to properly account for power consumption in static blocks exhibiting dynamic switching behavior. In a second embodiment, static timer data including clock phase tags are used to account for static and dynamic behavior, thereby permitting proper accounting for power consumption with mixed static and dynamic blocks.

Note that the invention describes terms such as comparing, validating, selecting or other terms that could be associated with a human operator. However, for at least a number of operations described herein which form part of the present invention, no action by a human operator is desirable. The operations described are, in large part, machine operations processing electrical signals to generate other electrical signals.

Refer now to the drawings wherein depicted elements are not necessarily shown to scale and wherein like or similar elements are designated by the same reference numeral through the several views.

Refer now to FIG. 1 in which is illustrated a flow chart according to an embodiment of the present invention. As discussed hereinabove, a logic device for which a power consumption determination is to be made typically includes a plurality of logic blocks, each performing a logical operation in response to a plurality of input signals. The input signals may include inputs into the logical device in which a particular logic block is incorporated, or may constitute signals received from other logic blocks within the logic device. A particular logic block may output a signal to other logic blocks within the logic device being simulated, or output a signal constituting an output signal of the logic device in which it is included.

In step 101, of an embodiment of the method of the present invention, a list is generated of logic block types, and the number of occurrences of each, appearing in the logic device being simulated. Alternatively, the logic block list may be input, in step 101, from a database generated externally, and wherein the inputting may be automated by a data processing system. Power consumption will be calculated on a cycle-by-cycle basis for each logic block in the logic device under simulation, and in step 102 counters for looping over device cycles and logic blocks are initialized.

Power consumption determination begins in step 103 with the entry of the per switching transition power consumption for the "ith" logic block type in a logic block list. The logic block list may be entered from a netlist for the device. A netlist includes the logic blocks constituting the device and their interconnections. Each logic block may have one or more input nodes and an output node. Each output is coupled to a net that forms the connections to the inputs to one or more succeeding logic blocks, or to an output of the logic device. The netlist includes the load capacitances on the net connected to each output node. Power consumption is computed on a logic block by logic block basis, beginning with the first logic block in the logic block list. The per switching transition power consumed by each logic block in the logic block list is entered in step 103 in order to calculate the contribution of the power consumed by that logic block in the current cycle. The per transition power consumption rule may be entered from a database of values generated by circuit level simulation software, according to well-known physical principals. Entry of per transition power consumption data for each circuit type, in step 103, from an external database may be automated by a data processing system. Alternatively, an embodiment of the method of the present invention may generate and store per transition power consumption, in step 103, for each circuit type in the logic block list according to one of physical principals, the power consumption per cycle being the energy dissipated in making a transition of logic state. The energy dissipated is the energy stored in the load capacitances on the output node of the current logic block. These may be ascertained from the netlist, as described hereinabove.

Transition behavior (i.e., 0, 1, or 2 switches) for the current logic block type in the current cycle is computed using the results from multivalued single cycle logic simulation data input in step 104. The number of switching transitions are computed in step 105. Multivalued single cycle simulations include information characterizing the behavior of the logic block, dynamic or static, in addition to the usual output Boolean state of the block at the end of each cycle. The output of a multivalued single cycle simulation includes the output logic state, cycle-by-cycle, and a tag denoting whether that output logic state is a dynamic state or a static state. A static state holds its Boolean value over the entire clock cycle, and a dynamic state precharges to a first value, and then evaluates to a second, opposite, value. That is, if the logic state is a dynamic state that evaluates to zero, it will have precharged to one, and conversely, if it evaluates to one, then it will have precharged to zero. Multivalue simulation data for a logic block may be generated using multivalue truth tables for the block. These account for the state, dynamic or static, of the input signals as well as their Boolean value, and output a Boolean value and static/dynamic tag accordingly, and would be understood by an artisan of ordinary skill.

In step 108, the jth cycle power consumption by the "ith" logic block is computed. The per cycle power consumption may be determined from the number of switching transitions each node in the ith logic block makes in the current cycle. The number of switching transitions may, in turn, be ascertained from the multivalued logic state of the node in the current cycle and the multivalued logic state in the previous cycle. These are provided from the multivalued single cycle input in step 104. The number of switching transitions, in terms of these quantities, is summarized in Table 1:

TABLE 1

| $S_i(n)$ | $S_i(n-1)$ | | | |
| --- | --- | --- | --- | --- |
| | S0 | D0 | S1 | D1 |
| S0 | 0 | 0 | 1 | 1 |
| D0 | 2 | 2 | 1 | 1 |
| S1 | 1 | 1 | 0 | 0 |
| D1 | 1 | 1 | 2 | 2 |

Here S and D are used as tags to denote static and dynamic logic states, respectively. It would be understood by one of ordinary skill in the art, that any other "two-valued" tag could be used to label the states. The multivalued logic states of the "ith" node in cycle n, $S_i(n)$, are represented by the table rows, and the multivalued logic states of the "i th" node in cycle n−1, $S_i(n-1)$ by the table columns. The per cycle power consumption by the "ith" node is then given by the per transition power consumption for that node as determined by the rule input in step 103 multiplied by the number of transitions in the current cycle, as determined from Table 1.

In step 109, the power per cycle for the current logic block is accumulated with the power per cycle in the current cycle for the previous logic blocks. Then, in step 110, if the current logic block is a last logic block to be calculated in the current cycle, in step 111 a determination is made whether the current cycle is the last cycle to be simulated. If the current cycle is not the last cycle, in step 112, the total power per cycle consumed by all of the logic blocks in the current cycle is added to the power per cycle consumed in the previous clock cycles. The cycle counter is incremented in step 113. Then, the type counter is reset in step 114 and the method returns to step 104. However, if, in step 111, the last cycle has been simulated, the power consumption for the logic device under simulation is generated in step 115 by multiplying the total power per cycle consumed over all of the cycles computed for all of the logic blocks constituting the logic device by the clock frequency of the logic device, and dividing the result by the number of cycles simulated.

If, however, in step 110, the power consumption per cycle of all logic block types has not been calculated for the current cycle, the type counter is incremented in step 116 whereby the calculation will advance to the next logic block for the current cycle by returning to step 103 if, in step 117, the current cycle is the first cycle. Otherwise, in step 117, the method returns to step 104.

Figure 2A:
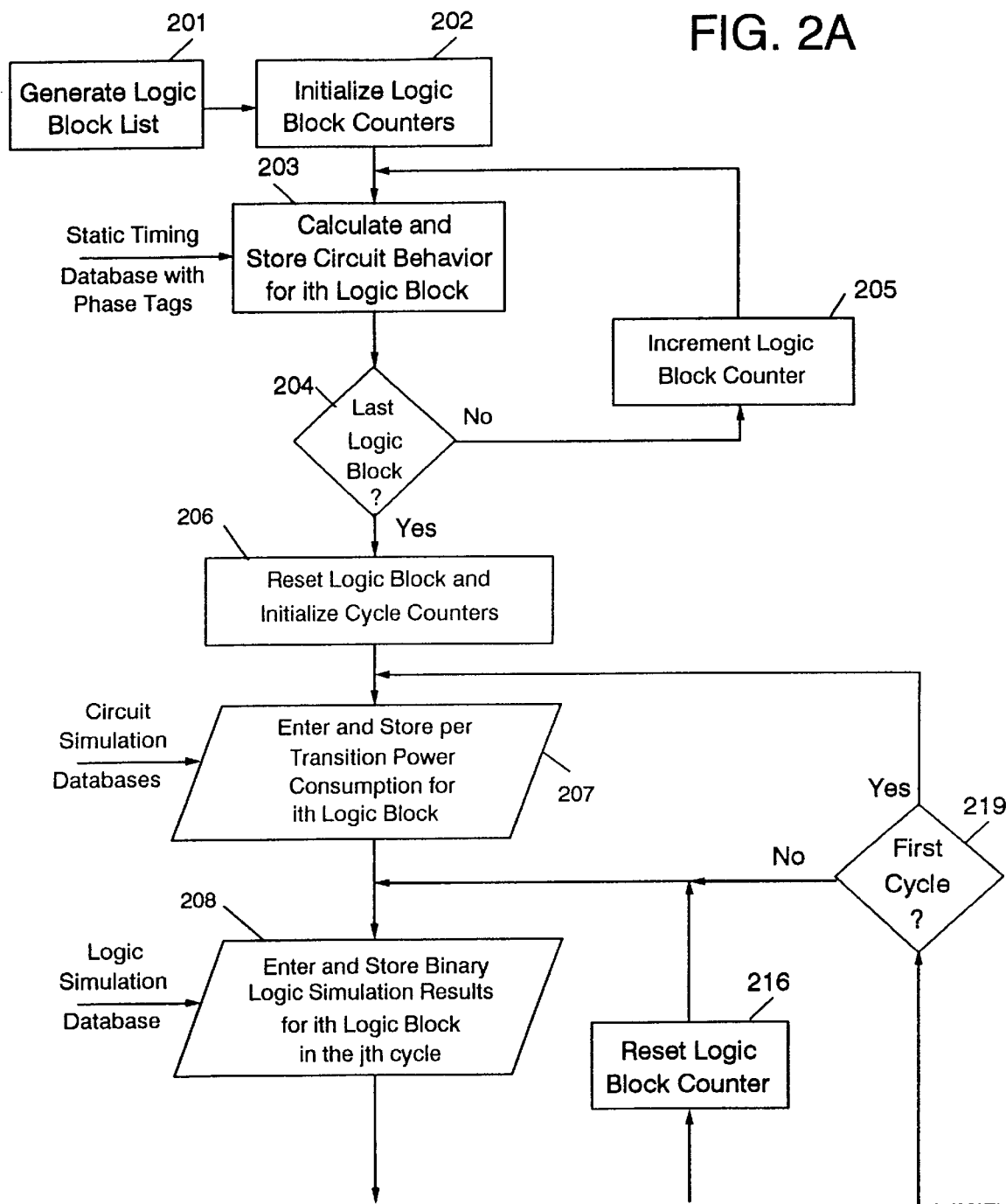

Refer now to FIG. 2 illustrating a flow diagram according to an alternative embodiment of a method of the present invention. As in the embodiment of FIG. 1, the method begins by generating a logic block list enumerating the logic blocks incorporated in the logic device under simulation, in step 201. The behavior, dynamic or static, is first calculated for each logic block. In step 202, a block counter is initialized, and, in step 203, the behavior of the ith block is calculated and stored. Blocks are then looped over, in steps 204 and 205 until in step 204, the last block has been calculated.

Figure 3A:
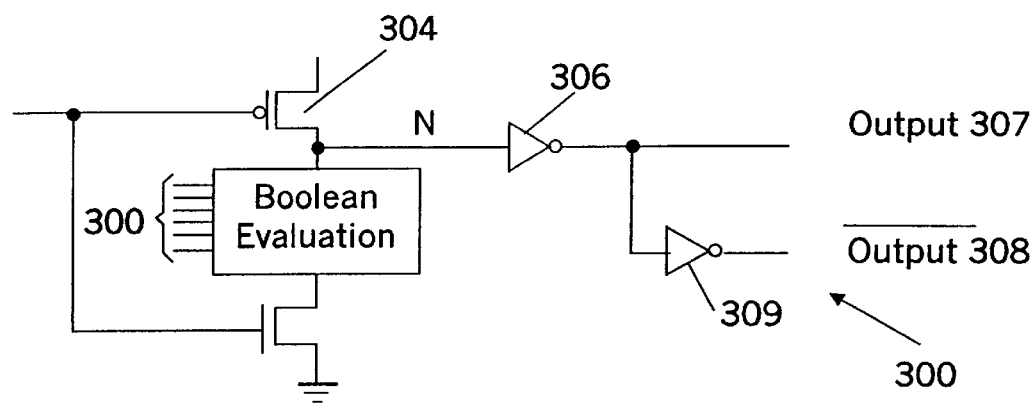
FIG. 3A illustrates a typical dynamic logic block used in an explanation of an embodiment of a method of the present invention.

In order to better understand the computation of the circuit behavior, refer now to FIG. 3A in which is illustrated a typical dynamic logic circuit 300 of the domino type. Dynamic logic circuit 300 includes a Boolean evaluation circuit 301 that receives a plurality of logical inputs 302. In response to these logical input signals, a logical output value appears on node N coupled to an output of Boolean evaluation circuit 301. Dynamic logic circuit 300 is clocked by clock signal 303, and during a first half cycle of clock 303 evaluation node N is precharged through p-type metal oxide semiconductor (PMOS) device 304. Following precharge, during a second half cycle of clock 303, evaluation node N assumes a logical value determined by the calculation implemented in Boolean evaluation circuit 301 in response to the plurality of inputs 302. During evaluation, a foot of Boolean evaluation circuit 301 is coupled to ground through n-type metal oxide semiconductor (NMOS) device 305. The logical signal on evaluation node N is inverted by inverter 306 to form output 307 of dynamic logic circuit 300. Thus, output 307 is the logical complement of the logical signal on evaluation node N. A complementary output 308 is also provided via a second inverter, inverter 309, whose input is coupled to output 307 to generate complementary output 308.

Figure 3B:
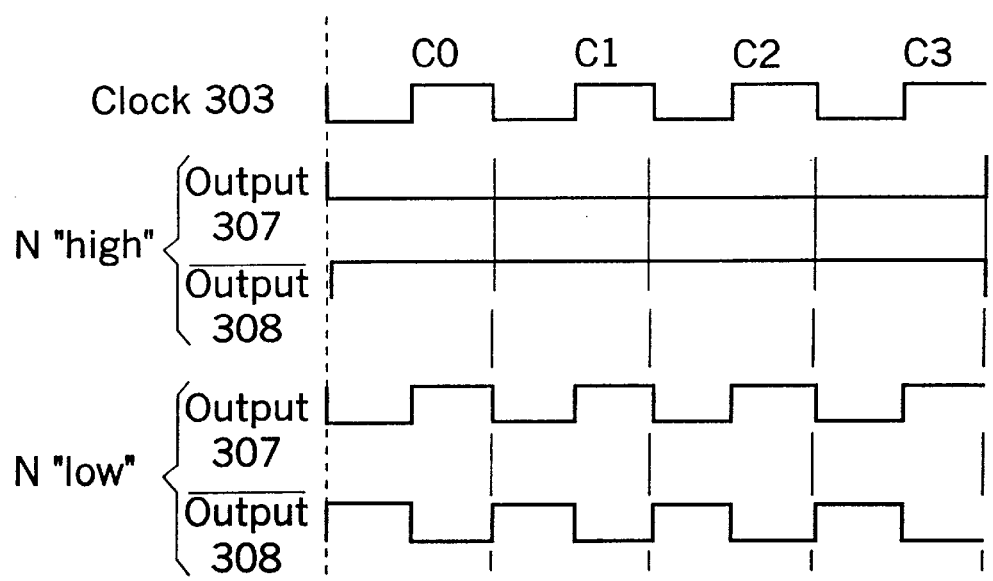
FIG. 3B illustrates a toggling sequence of a typical dynamic logic block used in an explanation of an embodiment of a method of the present invention.

In FIG. 3B, the logic states of output 307 and its complement, output 308 are shown, along with four cycles of clock 303. If N evaluates "high", output 307 is "low" and remains low independent of the transitions of clock 303. (Center illustration in FIG. 3B.) Concomitantly, output 308 assumes a "high" logic state and remains high independent of the transitions of clock 303. (Center illustration in FIG. 3B.) In other words, when node N evaluates "high", the outputs of dynamic logic 300 make no transitions. Conversely, when node N evaluates "low", the output 307 falls on a falling edge of clock 303, and rises on a rising edge of clock 303. (Bottom illustration, FIG. 3B.) In other words, the logic state of output 307 tracks the logical value of clock 303, and makes two transitions per clock cycle. Output 308 is the logical complement of output 307, and falls on a rising edge of clock 303 and rises on a falling) edge of clock 303. (Bottom illustration, FIG. 3B.) Thus, for dynamic logic circuit 300, the minimal phase tag information may be enumerated as follows: output 307 rises on a rising clock edge and falls on a falling clock edge, and output 308 falls on a rising clock edge and rises on a falling clock edge. These clock edge tags fully characterize dynamic logic 300. Because there is no power consumption if an output node makes no transition, it is unnecessary to characterize the behavior as either dynamic or static if no transition occurs in a particular clock cycle.

Provided all dynamic circuits precharge on the same clock phase, dynamic circuit behavior can be inferred from the output transition and clock edge tags. Dynamic behavior is signaled if either: (1) the output node falls when the clock edge rises and the output node arises when the clock edge falls, or (2) conversely, the output node rises when the clock edge rises and the output node falls when the clock edge falls. In contrast, static behavior is signaled if the output both rises and falls on the same clock edge. That is, an output node may both rise and fall on a rising clock edge, or, both rise and fall on a falling clock edge. In other words, transitions, when they occur, take place on the same clock edge, regardless of whether the particular transition is a rising transition or is a falling translation. This is summarized in Table 2 which enumerates all possibilities for the behavior of an output node in relation to a clock signal. The output node falling when the clock rises and rising when the clock falls, corresponds to the behavior of output 308 in FIG. 3A. The other possibility, that the output node falls when the clock falls and rises when the clock rises, corresponds to output 307 in dynamic logic circuit 300 in FIG. 3A.

The characterization of the behavior of a logic block, either dynamic or static, may be implemented by defining two binary variables representing the clock edge tags on rising and falling outputs. Defining OF to be a binary variable representing the clock edge tag on a falling output, and OR to be a binary variable representing the clock edge tag on a rising output. Then, the binary variable OF is assigned values as follows. If the output falls when the clock falls, OF takes the value 0. Conversely, if the output falls when the clock rises, the binary variable OF takes the value 1. Similarly, for the binary variable OR, the value 0 is assigned if the output rises when the clock falls and the value 1 is assigned if the output rises when the clock rises. Then, the four possibilities enumerated in Table 2 may be represented by the truth values of the binary variables OF and OR as illustrated in Table 3.

In Table 3, the static behavior is assigned a truth value of zero, dynamic behavior a truth value of one, and the resulting truth table represented in Table 3 is that of the exclusive OR (XOR) of two Boolean variables.

TABLE 2

| OUTPUT NODE RISES WHEN | OUTPUT NODE FALLS WHEN | |
|---|---|---|
| | CLOCK FALLS | CLOCK RISES |
| CLOCK FALLS | Static Behavior | Dynamic Behavior |
| CLOCK RISES | Dynamic Behavior | Static Behavior |

TABLE 3

| | OR-OF | |
|---|---|---|
| | 0 | 1 |
| 0 | 0 | 1 |
| 1 | 1 | 0 |

Hence, circuit behavior may be computed in step 203 using the static timer database. Static timing analysis including clock phase tagging has been described in commonly assigned U.S. Pat. No. 5,210,700, hereby incorporated herein by reference. Although static timing analyses are, generally, directed to an accounting of propagation delays through a logic chain, they include a list of output logic states with the identity of the controlling clock edge for each block in the chain. This information is sufficient for the present invention.

Figure 4:
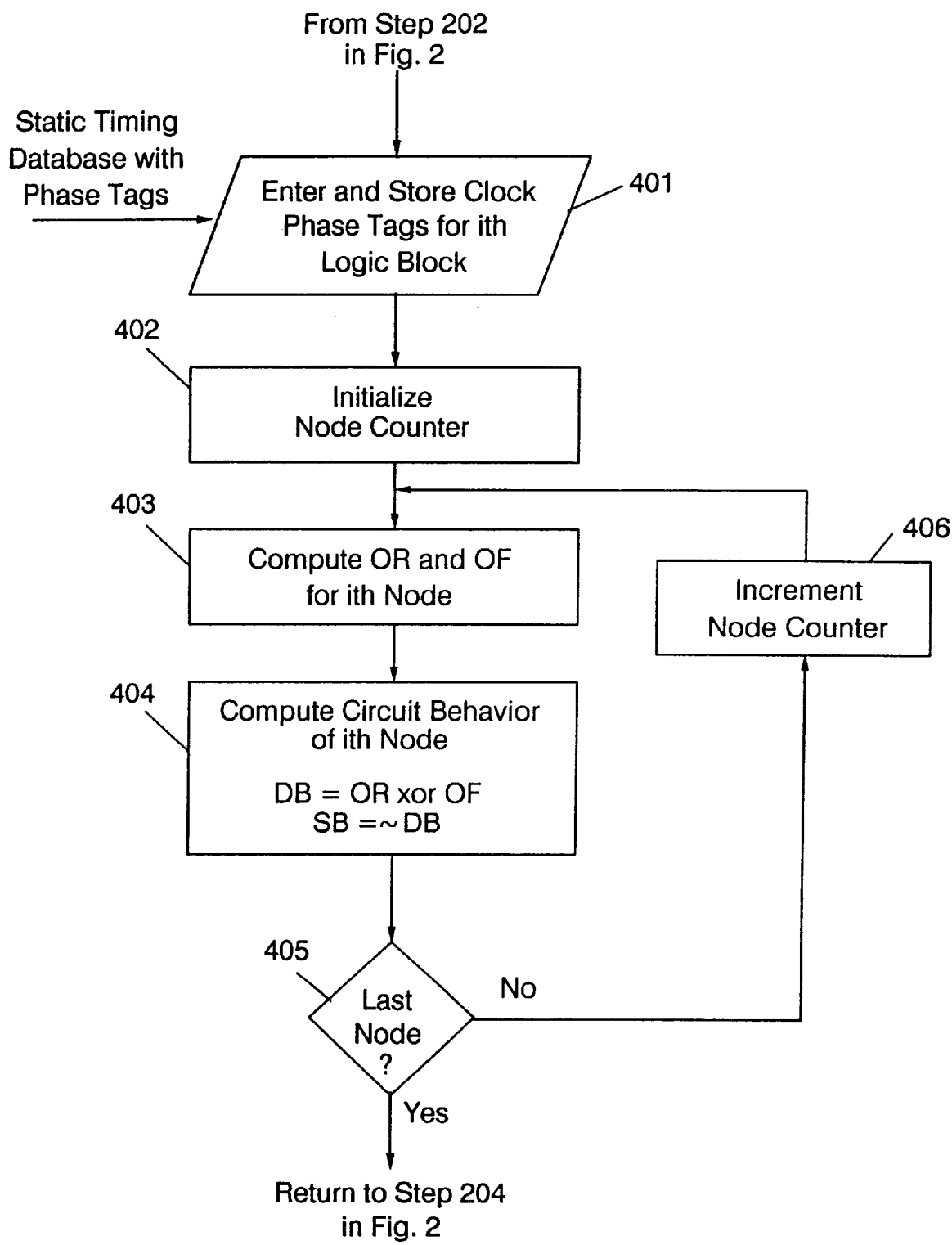
FIG. 4 illustrates, in flow diagram form, a method of characterizing logic circuit behavior according to an embodiment of the present invention.

Computation of the circuit behavior for all nodes of the current logic block in step 203 is detailed in the flow diagram illustrated in FIG. 4. Step 203 begins by entering, in step 401, the clock edge tags for the input and output nodes of the current logic block from the static timer data base. In step 402, a counter for looping over these nodes is initialized.

In step 403, the binary variables OR and OF are set. The binary variable OR is assigned values as follows. If the current node rises when the clock falls, OR takes the value 0. Conversely, if the node rises when the clock rises, the binary variable OR takes the value 1. Similarly, for the binary variable OF, the value 0 is assigned if the current node falls when the clock falls and the value 1 is assigned if the node falls when the clock rises.

The process continues in step 404 with the calculation of circuit behavior for the current node. The binary variable DB, which signals dynamic behavior is set to the exclusive "OR" of the binary variables OR and OF, and the binary variable SB, which signals static behavior, is set to the logical inverse of DB.

If the current node is not the last node, the method continues to step 406 where the node counter is incremented and then returns to step 403. However, if in step 404 the circuit behavior of all nodes has been computed, the process continues to step 204.

Once the circuit behavior of the last logic block has been computed, power consumption is calculated on a cycle-by-cycle and logic block by logic block basis. The counter indexing the logic block list is reset and a device cycle counter is initialized in step 206.

The per transition power consumption for the current logic block in the logic block list is entered and stored in step 207. The power consumption per transition for a particular logic block may be generated in a circuit level simulation in accordance with well-known physical principals. The per transition power consumption may be entered from a circuit level simulation database, in step 207. Alternatively, an embodiment of the present invention may generate the per cycle power consumption for the output node of the "jth" logic block in step 207. The per cycle power consumption represents the power consumed by a logic block when its output node transitions logic states, and may be determined using well-known physical principals, as previously described.

In step 208, the single cycle binary simulation data is entered and the number of times the node switches is computed. Using the logic states of the current logic block in the current cycle and the logic states in the previous cycle, the number of transitions of each node of the ith logic block in the current cycle may be computed. The logic states are obtained from the single cycle simulation data, and, with the circuit behavior determined in step 203, yield the number of current cycle switching transitions. The number of times a node switches may be expressed in terms of the following Boolean equation:

$$N = SB \cdot [S(j) \oplus S(j-1)] + 2 \cdot DB \cdot [S(j) \cdot OR + \overline{S(j)} \cdot OF] \quad (1)$$

In Equation (1), S(j) represents the logic state of the current node at the current, "jth", cycle, and S(j−1) denotes the logic state of the current node in the previous, "j−1st", cycle. Dynamic circuit behavior is represented by the Boolean variable DB and static behavior by the logical complement of DB, SB, as described hereinabove.

Equation (1) may be understood by first considering a block with static behavior. Then, DB is zero and SB, the complement of DB is one. Power is dissipated of the output node makes a transition, which is just expressed by the term $S(j) \oplus S(j-1)$ in Equation (1). If, however, the block exhibits dynamic behavior, SB is zero and DB is one.

If the block has dynamic behavior, the number of transitions, either zero or two, in the current cycle may be determined from the Boolean variables OR and OF, and the current logic state of the output node. Note first that OR and OF cannot both have the value one. Otherwise, DB would be zero, as the XOR of OR and OF. If OR is one, then the output rises when the clock rises, and output falls when the clock falls, corresponding to output 307 in FIG. 3. Then there are two transitions per cycle, if the jth logic state is one. Conversely, if OF is one and OR is zero, then the output falls when the clock rises and rises when the clock falls, corresponding to output 308 in FIG. 3. Then two transitions per cycle occur if the jth logic state is zero, as illustrated in FIG. 3B.

The per cycle power dissipation for the ith logic block is computed in step 210 by summing the power designated at each node. This is determined by the energy dissipated if a node switches multiplied by the number of times that the node switches in a clock cycle, if it switches at all.

The per cycle power dissipation of the current node is then given by N, as calculated from Equation (1), multiplied by the per cycle transition power dissipation by the current logic block from step 207. The per cycle power dissipation at the current output node is summed with the power dissipated at the prior nodes, in step 210.

If, in step 212, the power dissipation at all the logic blocks has been calculated in the current cycle, then the power calculated in step 211 is added to the sum of the total power dissipated through the previous clock cycle, in step 214. If the current, "jth", cycle is not the last cycle to be calculated, step 213, a cycle counter is incremented in step 215. A logic counter is reset in step 216 in order to begin calculation of the power dissipation for the next cycle, and the process returns to step 208.

If, however, in step 213, all cycles have been simulated, the power output is calculated in step 217. The power consumption is determined as the product of the total power per cycle accumulated over all of the clock cycles simulated, from step 214, and the clock frequency of the logic device under simulation divided by the number of cycles simulated, N.

If, in step 212, the per cycle power dissipation of all logic blocks have not been calculated for the current cycle, the method loops to calculate the power dissipation in the next logic block in the logic block list. In step 218, a logic block counter is incremented, and the method returns to step 207 to calculate the power consumption for the next logic block.

Figure 5:
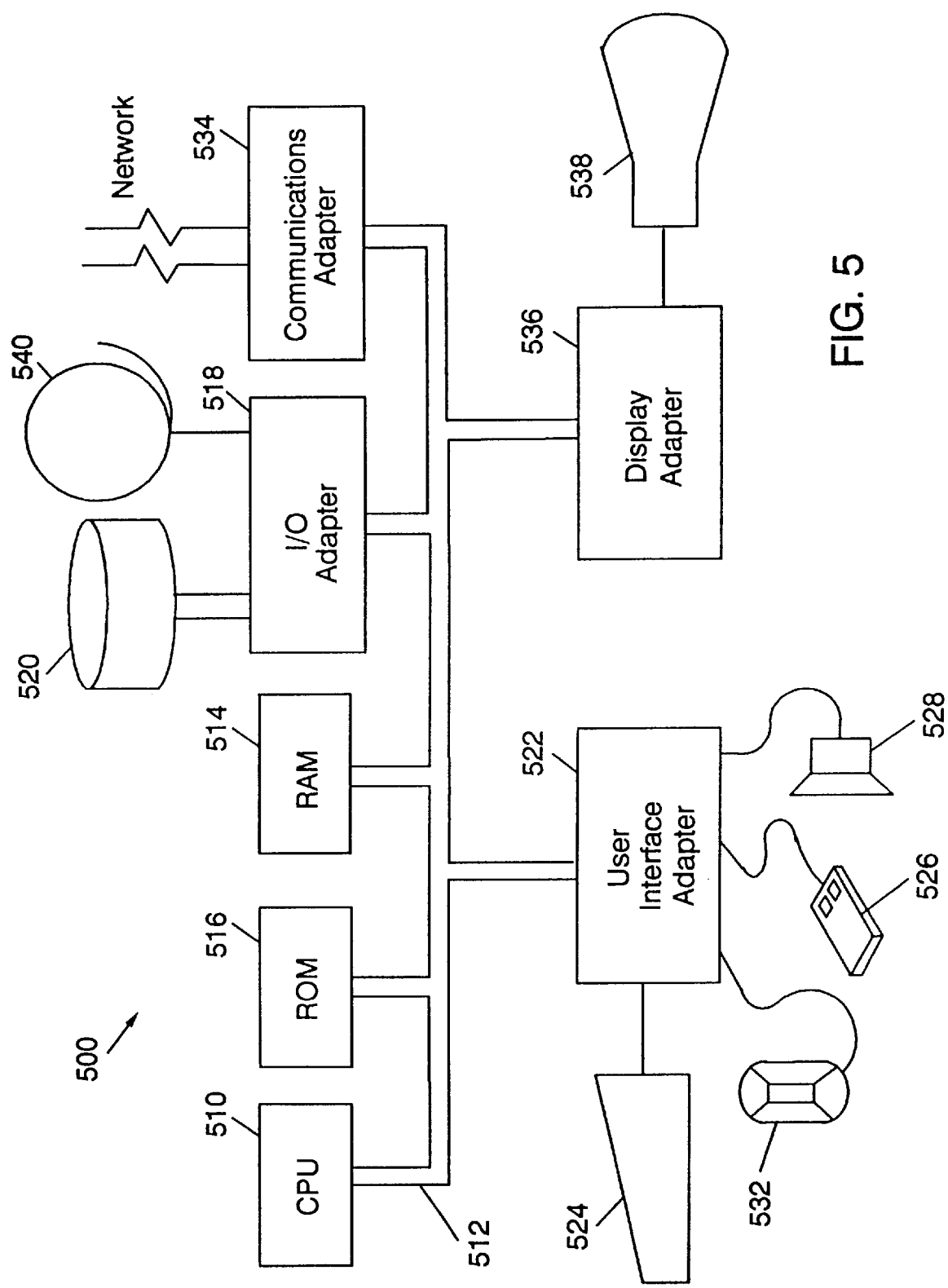
FIG. 5 illustrates, in block diagram form, a data processing system implemented in accordance with one embodiment of the present invention.

A representative hardware environment for practicing the present invention in such an embodiment is depicted in FIG. 5, which illustrates a typical hardware configuration of workstation 513 in accordance with the subject invention having central processing unit (CPU) 510, such as a conventional microprocessor, and a number of other units interconnected via system bus 512. Workstation 513 includes random access memory (RAM) 514, read only memory (ROM) 516, and input/output (I/O) adapter 518 for connecting peripheral devices such as disk units 520 and tape drives 540 to bus 512, user interface adapter 522 for connecting keyboard 524, mouse 526, and/or other user interface devices such as a touch screen device (not shown) to bus 512, communication adapter 534 for connecting workstation 513 to a data processing network, and display adapter 536 for connecting bus 512 to display device 538. CPU 510 may include other circuitry not shown herein, which will include circuitry commonly found within a microprocessor, e.g., execution unit, bus interface unit, arithmetic logic unit, etc. CPU 510 may also reside on a single integrated circuit. In one embodiment, a instruction set implementing the method of the present invention may be stored in ROM 516. In an alternative embodiment this instruction set may be located in a mass storage device, such as disk units 520. CPU 510 would then execute this instruction set in order to perform the steps of the method of the present invention, for example, the method of FIG. 1 or in another embodiment, the method of FIG. 2.

Preferred implementations of the invention include implementations as a computer system programmed to execute the method or methods described herein, and as a computer program product. According to the computer system implementation, sets of instructions for executing the method or methods are resident in the random access memory 514 of one or more computer systems configured generally as described above. Until required by the computer system, the set of instructions may be stored as a computer program product in another computer memory, for example, in disk drive 520 (which may include a removable memory such as an optical disk or floppy disk for eventual use in the disk drive 520). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Although the present invention and its advantages have been described in detail, it should be understood that various changes, substitutions and alterations can be made herein without departing from the spirit and scope of the invention as defined by the appended claims.

What is claimed is:

1. A method of determining power consumption in a logic device comprising the steps of:

inputting first and second tagged logic signals, wherein a tag has a first predetermined value if an input signal has dynamic behavior and a second predetermined value if said input signal has static behavior, and wherein said first tagged logic signal comprises a logic state of said logic device in a current cycle and said second tagged logic signal comprises a logic state in a previous cycle;

determining a number of switching transitions from said first and second tagged logic signals; and outputting a power consumption value, wherein said power consumption value comprises a per transition power consumption value multiplied by a clock signal frequency further multiplied by said number of switching transitions.

2. The method of claim 1 wherein said logic device includes a plurality of logic blocks, wherein said steps of inputting, determining and outputting are performed for each logic block in said plurality of logic blocks.

3. The method of claim 2 further comprising the step of summing each power consumption value for each logic block to form a total power consumption value for said logic device.

4. The method of claim 1 wherein said per transition power consumption value is obtained from a circuit simulation of said logic device.

5. The method of claim 1 wherein said steps of inputting, determining and outputting are repeated for a plurality of clock cycles of said logic device, said power consumption value determined at each clock cycle being added to a sum of power consumption values from all previous clock cycles, and wherein said sum of power consumption values is divided by a number of said clock cycles to form said power consumption of said logic device.

6. The method of claim 1 wherein said first and second tagged logic signals further comprise multivalued single-cycle simulation logic signals.

7. The method of claim 1 wherein said per transition power consumption value comprises a dissipation of energy stored in a capacitive load on an output of said logic device.

8. A method of determining power consumption in a logic device comprising the steps of:

determining a Boolean circuit behavior signal of said logic device in response to a plurality of clock edge tags and corresponding plurality of output transition logic signals;

inputting first and second logical output signals of said logic device wherein said first and second logical output signals comprise a logical state of said logic device in a current cycle and a previous cycle, respectively;

determining a number of transitions of said logic device in said current cycle from said Boolean circuit behavior signal and said first and second logical output signals; and outputting a power consumption value, wherein said power consumption value comprises a per transition power consumption value multiplied by a clock signal frequency further multiplied by said number of transitions.

9. The method of claim 8 wherein said step of determining said number of transitions further comprises the step of, if said Boolean circuit behavior signal has a first predetermined value, doubling a first Boolean signal, wherein said first Boolean signal is formed by the steps of:

ANDing said first logical output signal with a second Boolean signal;

ANDing a logical complement of said first logical output signal with a third Boolean signal; and ORing a logical value formed by said step of ANDing said first logical output signal and a logical value formed by said step of ANDing said logical complement.

10. The method of claim 9 wherein said second Boolean signal comprises an output rising Boolean signal.

11. The method of claim 10 wherein said output rising Boolean signal has a first predetermined value if said plurality of output transition logic signals rises when a clock signal rises and a second predetermined value if said plurality of output transition logic signals falls when said clock signal falls.

12. The method of claim 11 wherein said first predetermined value is one and said second predetermined value is zero.

13. The method of claim 9 wherein said third Boolean signal comprises an output falling Boolean signal.

14. The method of claim 13 wherein said output falling Boolean signal has a first predetermined value if said plurality of output transition logic signals falls when a clock signal rises and a second predetermined value if said output signal falls when said clock signal falls.

15. The method of claim 14 wherein said first predetermined value is one and said second predetermined value is zero.

16. The method of claim 8 wherein said step of determining said number of transitions further comprises the step of, if said Boolean circuit behavior signal has a second predetermined value, forming an exclusive-or (XOR) of said first and second logical output signals.

17. The method of claim 16 wherein said second predetermined value is zero.

18. The method of claim 8 wherein said logic device includes a plurality of logic blocks, and wherein said steps of determining said Boolean circuit behavior signal, inputting said first and second logical output signals, determining said number of transitions, and outputting a power consumption value are performed for each logic block in said plurality of logic blocks.

19. The method of claim 18 further comprising the step of summing each power consumption values for each logic block to form a total power consumption value for said logic device.

20. The method of claim 8 wherein said steps of determining said Boolean circuit behavior signal, inputting said first and second logical output signals, determining said number of transitions, and outputting a power consumption value are repeated for a plurality of clock cycles of said logic device, said power consumption value determined at each clock cycle being added to a sum of power consumption values from all previous clock cycles, and wherein said sum of power consumption values is divided by a number of clock cycles to form said power consumption of said logic device.

21. A data processing system comprising:

circuitry operable for inputting first and second tagged logic signals, wherein a tag has a first predetermined value if an input logic signal has dynamic behavior and a second predetermined value if said input logic signal has static behavior, and wherein said first tagged logic signal comprises a logic state of a logic device in a current cycle and said second tagged logic signal comprises a logic state in a previous cycle;

circuitry operable for determining a number of switching transitions from said first and second tagged logic signals; and circuitry operable for outputting a power consumption value, wherein said power consumption value comprises a per transition power consumption value multiplied by a clock signal frequency further multiplied by said number of switching transitions.

22. The data processing system of claim 21 wherein said logic device includes a plurality of logic blocks, and wherein said data processing system further comprises circuitry operable for repeating said inputting, determining, and outputting for each logic block in said plurality of logic blocks.

23. The data processing system of claim 22 further comprising circuitry operable for summing each power consumption value for each logic block to form a total power consumption value for said logic device.

24. The data processing system of claim 21 further comprising:

circuitry operable for repeating said inputting, determining, and outputting for a plurality of clock cycles of said logic device; and circuitry operable for adding said power consumption value determined for each clock cycle to a sum of power consumption values from all previous clock cycles, and wherein said sum of power consumption values is divided by a number of clock cycles to form said power consumption of said logic device.

25. The data processing system of claim 21 further comprising circuitry operable for receiving said first and second tagged logical signals from a data processing network.

26. A data processing system comprising:

circuitry operable for determining a Boolean circuit behavior signal of a logic device in response to a plurality of clock edge tags and a corresponding plurality of output transition logic signals;

circuitry operable for inputting first and second logical output signals of said logic device wherein said first and second logical output signals comprise a logical state of said logic device in a current cycle and a previous cycle, respectively;

circuitry operable for determining a number of transitions of said logic device in said current cycle from said Boolean circuit behavior signal and said first and second logical output signals; and circuitry operable for outputting a power consumption value, wherein said power consumption value comprises a per transition power consumption value multiplied by a clock signal frequency further multiplied by said number of transitions.

27. The data processing system of claim 26 wherein, if said Boolean circuit behavior signal has said first predetermined value, said circuitry operable for determining said number of transitions comprises:
   circuitry operable for doubling a first Boolean signal; and
   circuitry operable for outputting said first Boolean signal, said circuitry comprising:
      circuitry operable for ANDing said first logical output signal with a second Boolean signal;
      circuitry operable for ANDing a logical complement of said first logical output signal with a third Boolean signal; and
      circuitry operable for ORing a logical value formed by said circuitry for ANDing said first logical output signal and a logical value formed by said circuitry for ANDing said logical complement.

28. The data processing system of claim 27 wherein said second Boolean signal comprises an output rising Boolean signal.

29. The data processing system of claim 27 wherein said third Boolean signal comprises an output falling Boolean signal.

30. The data processing system of claim 26 wherein said circuitry operable for determining said number of transitions further comprises circuitry, if said Boolean circuit behavior signal has a second predetermined value, operable for forming an exclusive-or (XOR) of said first and second logical output signals.

31. The data processing system of claim 26 wherein said logic device includes a plurality of logic blocks, and wherein said data processing system further comprises circuitry operable for repeating said determining said Boolean circuit behavior, said inputting said first and second logical output signals, and said outputting a power consumption value for each logic block in said plurality of logic blocks.

32. The data processing system of claim 31 further comprising circuitry operable for summing each power consumption value for each logic block to form a total power consumption value for said logic device.

33. The data processing system of claim 26 further comprising:
   circuitry operable for repeating said determining said Boolean circuit behavior signal, said inputting said first and second logical output signals, said determining said number of transitions, and said outputting said power consumption value, for a plurality of clock cycles of said logic device; and
   circuitry operable for adding said power consumption value determined for each clock cycle to a sum of power consumption values from all previous clock cycles, and wherein said sum of power consumption values is divided by a number of clock cycles to form a power consumption of said logic device.

34. The data processing system of claim 26 further comprising circuitry operable for inputting said first and second logical output signals from a data processing network.

35. A program product adaptable for storage on a program storage medium, the program product operable for determining power consumption in a logic device, said program product comprising:
   programming for inputting first and second tagged logic signals, wherein a tag has a first predetermined value if an input signal has dynamic behavior and a second predetermined value if said input signal has static behavior, and wherein said first tagged logic signal comprises a logic state of said logic device in a current cycle and said second tagged logic signal comprises a logic state in a previous cycle;
   programming for determining a number of switching transitions from said first and second tagged logic signals; and
   programming for outputting a power consumption value, wherein said power consumption value comprises a per transition power consumption value multiplied by a clock signal frequency further multiplied by said number of switching transitions.

36. The program product adaptable for storage on a program storage medium of claim 35 wherein said logic device includes a plurality of logic blocks, further comprising programming for repeating said inputting, determining and outputting for each logic block in said plurality of logic blocks.

37. The program product adaptable for storage on a program storage medium of claim 36 further comprising programming for summing each power consumption value for each logic block to form a total power consumption value for said logic device.

38. The program product adaptable for storage on a program storage medium of claim 35 further comprising:
   programming for repeating said inputting, determining and outputting for a plurality of clock cycles of said logic device; and
   programming for adding said power consumption value determined at each clock cycle to a sum of power consumption values from all previous clock cycles, and wherein said sum of power consumption values is divided by a number of clock cycles to form said power consumption of said logic device.

39. The program product adaptable for storage on a program storage medium of claim 35 wherein said first and second tagged logic signals further comprise multivalued, single-cycle simulation logic signals.

40. A program product adaptable for storage on a program storage media, the program product operable for determining power consumption in a logic device, said program product comprising:
   programming for determining a Boolean circuit behavior signal of said logic device in response to a plurality of clock edge tags and corresponding plurality of output transition logic signals;
   programming for inputting first and second logical output signals of said logic device wherein said first and second logical output signals comprise a logical state of said logic device in a current cycle and a previous cycle, respectively;
   programming for determining a number of transitions of said logic device in said current cycle from said Boolean circuit behavior signal and said first and second logical output signals; and
   programming for outputting a power consumption value, wherein said power consumption value comprises a per transition power consumption value multiplied by a clock signal frequency further multiplied by said number of transitions.

41. The program product adaptable for storage on a program storage media of claim 40 wherein, if said Boolean circuit behavior signal has a first predetermined value, said programming for determining said number of transitions further comprises:

programming for doubling a first Boolean signal; and programming outputting said first Boolean signal, said programming comprising:

programming for ANDing said first logical output signal with a second Boolean signal;

programming for ANDing a logical complement of said first logical output signal with a third Boolean signal; and programming for ORing a logical value formed by said programming for ANDing said logical output signal and a logical value formed by said programming for ANDing said logical complement.

42. The program product adaptable for storage on a program storage media of claim 41 wherein said second Boolean signal comprises an output rising Boolean signal.

43. The program product adaptable for storage on a program storage media of claim 41 wherein said third Boolean signal comprises an output falling Boolean signal.

44. The program product adaptable for storage on a program storage media of claim 40 wherein said logic device includes a plurality of logic blocks, and wherein said program product further comprises programming for repeating said determining said Boolean circuit behavior, said inputting said first and second logical output signals, said determining said number of transitions, and said outputting a power consumption value for each logic block in said plurality of logic blocks.

45. The program product adaptable for storage on a program storage media of claim 44 further comprising programming for summing each power consumption value for each logic block to form a total power consumption value for said logic device.

46. The program product adaptable for storage on a program storage media of claim 40 further comprising:

programming for repeating said determining said Boolean circuit behavior signal, said inputting said first and second logical output signals, said determining said number of transitions, and said outputting for a plurality of clock cycles of said logic device; and programming for adding said power consumption value determined for each clock cycle to a sum of power consumption values from all previous clock cycles, and wherein said sum of power consumption values is divided by a number of clock cycles to form said power consumption of said logic device.

\* \* \* \* \*

UNITED STATES PATENT AND TRADEMARK OFFICE
CERTIFICATE OF CORRECTION

PATENT NO. : 6,338,025 B1
DATED : January 8, 2002
INVENTOR(S) : Michael Alexander Bowen, Byron Lee Krauter, Steven Arthur Schmidt, Clay Chip Smith and Amy May Tuvell It is certified that error appears in the above-identified patent and that said Letters Patent is hereby corrected as shown below:

Column 8,
Line 66, replace "output" with -- output --.

Signed and Sealed this

Fourth Day of June, 2002

Attest:

Attesting Officer

JAMES E. ROGAN
Director of the United States Patent and Trademark Office